(12) United States Patent
Miyachi et al.

(10) Patent No.: US 8,377,591 B2
(45) Date of Patent: Feb. 19, 2013

(54) ANODE MATERIAL FOR SECONDARY BATTERY, ANODE FOR SECONDARY BATTERY AND SECONDARY BATTERY THEREWITH

(75) Inventors: Mariko Miyachi, Minato-ku (JP); Hironori Yamamoto, Minato-ku (JP)

(73) Assignee: NEC Corporation, Tokyo (JP)

( * ) Notice: Subject to any disclaimer, the term of this patent is extended or adjusted under 35 U.S.C. 154(b) by 1118 days.

(21) Appl. No.: 10/584,218

(22) PCT Filed: Dec. 24, 2004

(86) PCT No.: PCT/JP2004/019336
§ 371 (c)(1),
(2), (4) Date: Jun. 23, 2006

(87) PCT Pub. No.: WO2005/064714
PCT Pub. Date: Jul. 14, 2005

(65) Prior Publication Data
US 2007/0122700 A1    May 31, 2007

(30) Foreign Application Priority Data

Dec. 26, 2003    (JP) .................................. 2003-434001

(51) Int. Cl.
*H01M 4/02*    (2006.01)
*H01M 4/13*    (2010.01)
*H01M 4/58*    (2010.01)
(52) U.S. Cl. ................. 429/218.1; 429/209; 429/231.95
(58) Field of Classification Search .................. 429/224, 429/209, 218.1, 231.95
See application file for complete search history.

(56) References Cited

U.S. PATENT DOCUMENTS
5,395,711 A * 3/1995 Tahara et al. ................. 429/332
(Continued)

FOREIGN PATENT DOCUMENTS
EP    1231654 A1 *  8/2002
JP    8-130011 A    5/1996
(Continued)

OTHER PUBLICATIONS

Machine translation of JP 09245771 A, Inoue et al., Sep. 1997.*
(Continued)

*Primary Examiner* — Basia Ridley
*Assistant Examiner* — Sean P Cullen
(74) *Attorney, Agent, or Firm* — Sughrue Mion, PLLC

(57) ABSTRACT

An objective of this invention is to provide an anode material for a secondary battery for forming a secondary battery exhibiting a higher initial charge/discharge efficiency, a higher energy density and excellent cycle properties; an anode for a secondary battery; and a secondary battery therewith. An anode material for a secondary battery according to this invention comprises an Si oxide and at least one noble metal. Furthermore, the anode material for a secondary battery of this invention preferably contains lithium metal. Alternatively, an anode material for a secondary battery of this invention may comprise a lithium silicate and at least one noble metal. An anode comprising the anode material for a secondary battery of this invention comprises an activator layer being film-structure or particulate. In this invention, such an anode material can be used to provide an anode material for a secondary battery for forming a secondary battery exhibiting a higher initial charge/discharge efficiency, a higher energy density and excellent cycle properties; an anode for a secondary battery; and a secondary battery therewith.

2 Claims, 1 Drawing Sheet

U.S. PATENT DOCUMENTS

| | | | |
|---|---|---|---|
| 5,707,756 A * | 1/1998 | Inoue et al. | 429/57 |
| 6,001,139 A * | 12/1999 | Asanuma et al. | 29/623.3 |
| 6,053,953 A * | 4/2000 | Tomiyama et al. | 29/623.1 |
| 6,371,995 B1 * | 4/2002 | Yasunami | 29/623.1 |
| 2002/0061446 A1 * | 5/2002 | Gan et al. | 429/231.8 |
| 2002/0168574 A1 * | 11/2002 | Ahn et al. | 429/232 |
| 2003/0054249 A1 * | 3/2003 | Yamamoto et al. | 429/231.1 |
| 2004/0166409 A1 * | 8/2004 | Takada et al. | 429/218.1 |
| 2004/0234857 A1 * | 11/2004 | Shiozaki et al. | 429/231.3 |
| 2005/0019659 A1 * | 1/2005 | Shiozaki et al. | 429/231.3 |
| 2006/0068296 A1 * | 3/2006 | Nakagawa et al. | 429/324 |

FOREIGN PATENT DOCUMENTS

| | | |
|---|---|---|
| JP | 08-264178 | 10/1996 |
| JP | 09-245771 | 9/1997 |
| JP | 09-283180 | 10/1997 |
| JP | 2997741 | 11/1999 |
| JP | 3010226 | 12/1999 |
| JP | 2000-003727 A | 1/2000 |
| JP | 2001-351614 | 12/2001 |
| JP | 2002-42806 | 2/2002 |
| JP | 2002-260637 | 9/2002 |
| JP | 2002-373653 | 12/2002 |
| JP | 2003-017040 | 1/2003 |
| JP | 2003-192327 | 7/2003 |
| JP | 2004-273443 | 9/2004 |
| WO | WO 03044881 A1 * | 5/2003 |
| WO | WO 03081698 A1 * | 10/2003 |
| WO | WO 2004051784 A1 * | 6/2004 |

OTHER PUBLICATIONS

Hong Li, et al. "A High Capacity Nano-Si Composite Anode Material for Lithium Rechargeable Batteries", Electrochemical and Solid-State Letters, 2 (11) pp. 547-549, 1999.

* cited by examiner

ANODE MATERIAL FOR SECONDARY BATTERY, ANODE FOR SECONDARY BATTERY AND SECONDARY BATTERY THEREWITH

This application claims priority from PCT Application No. PCT/JP2004/019336 filed Dec. 24, 2004, and from Japanese Patent Application No. 2003-434001 filed Dec. 26, 2003, which applications are incorporated herein by reference.

TECHNICAL FIELD

This invention relates to an anode material for a secondary battery, an anode for a secondary battery and a secondary battery having the anode as a component.

BACKGROUND ART

As mobile terminals such as a cellular phone and a note-type personal computer have become widespread, a battery as their power source has become more important. Such a secondary battery must be small and light-weight While having a higher capacity and must exhibit a property that it is tolerant to degradation due to repetitive discharging and charging.

Lithium metal is sometimes used as an anode for such a secondary battery in the light of its higher energy density and light weight. There is, however, a problem that as a charge/discharge cycle is repeated, needle crystals (dendrites) are precipitated on a lithium surface during charge, and these crystals penetrate a separator to cause internal short-circuit, leading to a reduced battery life. When using a carbon material such as graphite and hard carbon capable of occluding and releasing lithium ions as an anode, a discharge-charge cycle can be successfully repeated. However, a graphite material may have a smaller capacity than lithium metal or a lithium alloy and thus have a larger irreversible capacity during the initial charge/discharge, leading to a lower charge/discharge efficiency and thus to a smaller energy density.

Recently, as a material for increasing an energy density, the use of Si as an anode activator has been investigated. It is believed that such an anode material may be used to provide a high capacity anode. An anode containing this type of Si exhibits a larger lithium occlusion/release amount per a unit volume and has a higher capacity. However, during occlusion or release of lithium ions, the electrode activator itself expands or shrinks, causing pulverization, and thus has a larger irreversible capacity during the initial-charge/discharge and a shorter charge/discharge cycle life.

For preventing pulverization of an anode, there has been reported the use of an Si oxide as an activator (Patent document 1). In the report, there has been observed that an Si oxide can be used as an activator to improved cycle properties because of reduction in a cubic expansion/shrinkage per a unit weight of the activator. There has been, however, a problem that the oxide is less conductive and thus less electro-collecting, leading to a larger irreversible capacity.
Patent document 1: Japanese Patent No. 2,997,741.

DISCLOSURE OF INVENTION

An objective of this invention is to provide a secondary battery exhibiting improved collection property, a higher charge/discharge efficiency in initial charge/discharge, a higher energy density and excellent cycle properties.

The present invention is described below. This invention can provide a secondary battery exhibiting a higher charge/discharge efficiency in initial charge/discharge, a higher energy density and excellent cycle properties.

[1] An anode material for a secondary battery which is used for an anode in a non-aqueous electrolyte secondary battery having at least the anode, a cathode and a lithium-ion conducting non-aqueous electrolyte, comprising an Si oxide and at least one noble metal.

[2] The anode material for a secondary battery as described in [1], wherein when the Si oxide is expressed in $SiO_z$, $0.8 \leq z \leq 2$.

[3] An anode material for a secondary battery which is used for an anode in a non-aqueous electrolyte secondary battery having at least the anode, a cathode and a lithium-ion conducting non-aqueous electrolyte, comprising a lithium silicate and at least one noble metal.

[4] The anode material for a secondary battery as described in [3], wherein when the lithium silicate is expressed in $Li_xSiO_y$, $0<x$ and $0<y \leq 4$.

[5] The anode material for a secondary battery as described in any of [1] to [4], further comprising lithium metal.

[6] The anode material for a secondary battery as described in any of [1] to [5], wherein the noble metal is at least one metal selected from the group consisting of Pd, Ag, Pt, Au, Rh, Ir, Ru, Os and Re.

[7] The anode material for a secondary battery as described in any of [1] to [6], wherein when a ratio of Si atoms to noble-metal atoms is expressed in a:b, $0.01<b/a$.

[8] The anode material for a secondary battery as described in any of [1] to [7], partially or wholly having an amorphous structure.

[9] An anode for a secondary battery, comprising an activator layer having a film-structure anode activator which comprises the anode material for a secondary battery as described in any of [1] to [8] on at least one side of an anode collector.

[10] The anode for a secondary battery as described in [9], wherein the activator layer is formed by a vacuum film-forming method.

[11] The anode for a secondary battery as described in [10], wherein the vacuum film-forming method is CVD, vacuum deposition or sputtering.

[12] An anode for a secondary battery, comprising an activator layer having a particulate-structure anode activator which comprises the anode material for a secondary battery as described in any of [1] to [8] on at least one side of an anode collector.

[13] The anode for a secondary battery as described in [12], wherein the anode activator is formed by mechanical processing.

[14] The anode for a secondary battery as described in [1-2], wherein the anode activator is formed by a vacuum film-forming method.

[15] The anode for a secondary battery as described in [14], wherein the vacuum film-forming method is CVD, vacuum deposition or sputtering.

[16] The anode for a secondary battery as described in any of [12] to [15], wherein the anode activator is further heat-treated.

[17] The anode for a secondary battery as described in any of [9] to [16], wherein a center-line average roughness (Ra) of the anode collector is 1/10 or more of a thickness of the anode collector.

[18] A non-aqueous electrolytic-solution secondary battery comprising the anode for a secondary battery as described in any of [9] to [17].

This invention can provide a secondary battery exhibiting a higher charge/discharge efficiency in initial charge/discharge, a higher energy density and excellent cycle properties.

1a: activator layer.
2a: composite.
3a: Si oxide.
4a: noble-metal.
5a: collector.

BEST MODE FOR CARRYING OUT THE INVENTION

Figure 1:
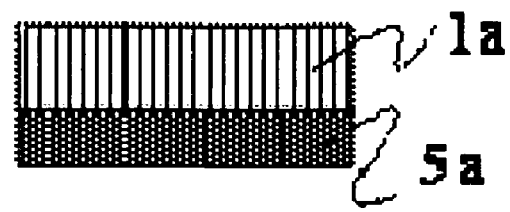
FIG. 1 is a cross-sectional view of an anode in a non-aqueous electrolytic-solution secondary battery as an embodiment of this invention.
Figure 4:
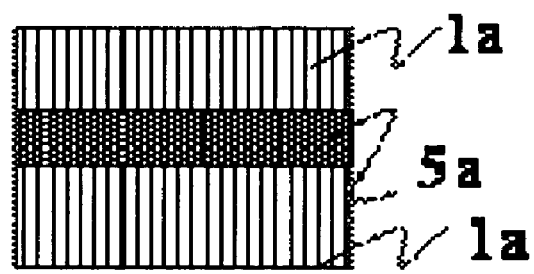
FIG. 4 is a cross-sectional view of an anode in a non-aqueous electrolytic-solution secondary battery as an embodiment of this invention.

FIG. 1 is a cross-sectional view of an anode in a non-aqueous electrolytic-solution secondary battery as an embodiment of this invention. As shown in this figure, the anode for a secondary battery of this invention has an activator layer 1a on at least one side of a collector 5a. In another embodiment, both sides of the collector 5a may have an activator layer 1a as shown in FIG. 4. The activator layer 1a is an anode member occluding or releasing Li during charge/discharge, which is made of an anode material for a secondary battery of this invention.

A first embodiment of an anode material for a secondary battery of this invention is an anode material for a secondary battery comprising an Si oxide and a noble metal as components. An Si oxide is an oxide of Si expressed in $SiO_z$ ($0<z\leq2$), preferably an Si oxide with $0.8\leq z\leq2$, more preferably $1\leq z<2$. The noble metal is at least one metal selected from the group consisting of Pd, Ag, Pt, Au, Rh, Ir, Ru, Os and Re and may be an alloy.

A second embodiment of an anode material for a secondary battery of this invention is an anode material for a secondary battery comprising a lithium silicate and a noble metal as components. The lithium silicate is expressed in $x'(Li_2O)+y'(SiO_2)$, which may be stoichiometric or non-stoichiometric. When being expressed in $Li_xSiO_y$, $0<x$ and $0<y\leq4$ is preferable. The noble metal is as described above.

The anode material for a secondary battery of this invention may further comprise lithium metal.

Such an anode material for a secondary battery can provide a secondary battery exhibiting a higher efficiency in initial charge/discharge, a higher energy density and excellent cycle properties, whose mechanism may be as follows. In an activator made of an anode material for a secondary battery according to this invention, Si contained improves an energy density. A conducting path, which is formed in the activator layer, improves collecting properties of the anode and Li can be released from the activator during discharging, resulting in increase in a charge/discharge efficiency. Furthermore, as well as improvement in corrosion resistance and oxidation resistance to an electrolytic solution improves post-cycle anode collection properties.

In an anode material for a secondary battery of this invention, when a ratio of Si atoms to noble-metal atoms is expressed in a:b, $0.01<b/a$ is preferable, $b/a\leq1$ is more preferable, and $0.05\leq b/a\leq0.50$ is further preferable.

In an anode material for a secondary battery of this invention when the material comprises lithium, a ratio of Li atoms to Si atoms (Li/Si) is preferably 0.1 to 8.

The activator layer 1a may be film-structure, which can be formed by, for example, CVD, vapor deposition, sputtering or plating, preferably by a vacuum film-forming method, more preferably by CVD, vacuum deposition or sputtering. For example, when employing sputtering or vapor deposition, the activator layer 1a can be formed by a process simultaneously using an Si oxide and a noble metal; an Si oxide, a noble metal and lithium metal; or a lithium silicate and a noble metal as targets, or alternately changing a target. When employing CVD, the activator layer 1a can be formed by alternately changing a source (source gas). Alternatively, the activator layer 1a can be formed by a process for laminating a noble metal film and an Si oxide film, where a noble metal is deposited by plating and an Si oxide is then deposited by CVD, vapor deposition or sputtering. The anode material for a secondary battery which constitutes the activator layer 1a may have a microcrystalline or amorphous structure, preferably have an amorphous structure. It is desirable that a raw material constituting the anode material for a secondary battery is uniformly distributed in the activator layer 1a. A thickness of the activator layer 1a is generally 0.1 μm to 250 μm, preferably 0.1 μm to 150 μm. The Si oxide may be doped with one of boron, phosphorous and antimony to reduce a resistivity. The activator layer 1a may comprise another Li-occluding substance such as Sn and an Sn oxide, or another metal such as Ti and Fe.

Figure 2:
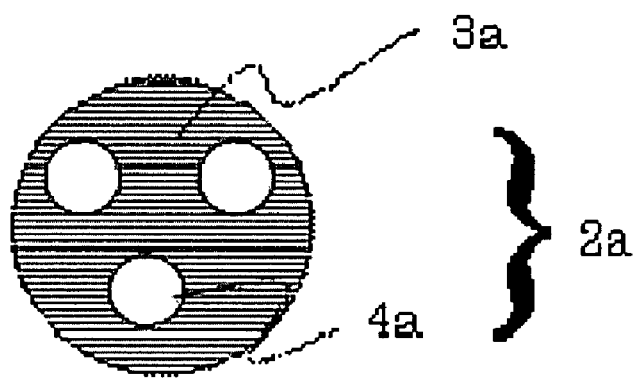
FIG. 2 is a cross-sectional view of an embodiment of an anode activator in this invention.
Figure 3:
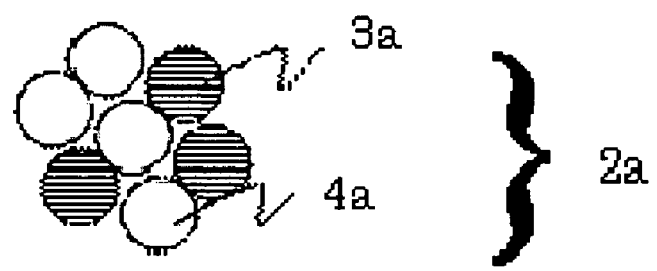
FIG. 3 is a cross-sectional view of an embodiment of an anode activator in this invention.

The activator layer 1a may have a particulate anode activator as a component. FIG. 2 and FIG. 3 are cross-sectional views of an example of a composite 2a as a particulate anode activator which constitutes the activator layer 1a. The composite 2a may be a mixture of or compound from an Si oxide 3a and a noble metal 4a. The composite 2a may have a structure where the noble metal 4a is present in a matrix of the Si oxide 3a as shown in FIG. 2 or a structure where the Si oxide 3a is present in a matrix of the noble metal 4a. Alternatively, the composite 2a may have, as shown in FIG. 3, a structure where a particulate Si oxide 3a and a particulate noble metal 4a are aggregated. The composite may be a mixture of or a compound from an Si oxide, a noble metal and lithium metal, or a mixture of or a compound from a lithium silicate and a noble metal. Here, it may have a structure where the noble metal or lithium metal is present in a matrix of the Si oxide or a lithium silicate, or a structure where the Si oxide, a lithium silicate or lithium metal is present in a matrix of the noble metal. Furthermore, it may have a structure where a particulate Si oxide, a particulate noble metal and a particulate lithium metal are aggregated or a structure where a particulate lithium silicate and a particulate metal are aggregated. A particle size of each raw material constituting the composite 2a is preferably 20 μm or less, more preferably 10 μm or less, further preferably 1 μm or less. It is desirable that the anode material for a secondary battery which constitutes the activator layer 1a made of the composite 2a has a microcrystalline or amorphous structure, preferably have an amorphous structure. It is desirable that a raw material constituting the anode material for a secondary battery is uniformly distributed in the composite 2a. The activator layer 1a may comprise another Li-occluding substance such as Sn and an Sn oxide, or another metal such as Ti and Fe.

The composite 2a to be such a particulate anode activator is desirably formed by mechanically processing the Si oxide 3a and the noble metal 4a. For instance, the composite 2a is formed by mechanical grinding with a ball mill or jet mill and then pressing; pressing using a mortar; or mechanical dry particulate composite forming. Also gas atomization is preferable. It is preferable that the materials are heat-treated during mixing to partially melt the Si oxide 3a or the noble metal 4a for fusion.

Alternatively, a bulk of the composite 2a may be formed by an appropriate process such as CVD, vapor deposition, sputtering and plating and then ground or classified to give the particulate composite 2a. The bulk is preferably formed by a vacuum film-forming method; preferably deposited by CVD, vacuum deposition or sputtering. For example, when employing sputtering or vapor deposition, the bulk of composite 2a can be formed by a process simultaneously using an Si oxide and a noble metal; an Si oxide, a noble metal and lithium metal; or a lithium silicate and a noble metal as targets, or alternately changing a target. When employing CVD, the bulk of the composite 2a can be formed by alternately changing a source (source gas). Alternatively, the bulk of composite 2a can be formed by a process for laminating a noble metal film and an Si oxide film, where a noble metal is deposited by plating and an Si oxide is then deposited by CVD, vapor deposition or sputtering. The bulk of the composite 2a thus obtained may be ground or classified to give the particulate composite 2a.

The composite 2a which is a bulk or particulate is preferably heat treated to partially melt the Si oxide 3a or the noble metal 4a for fusion.

The anode material for a secondary battery which constitutes the composite 2a may have a microcrystalline or amorphous structure, preferably comprise an amorphous structure. It is desirable that a raw material constituting the anode material for a secondary battery is uniformly distributed in the activator layer 1a. A thickness of the activator layer 1a is generally 0.1 μm to 250 μm, preferably 0.1 μm to 150 μm. The Si oxide may be doped with one of boron, phosphorous and antimony to reduce a resistivity. The activator layer 1a may comprise another Li-occluding substance such as Sn and an Sn oxide, or another metal such as Ti and Fe.

The activator layer 1a may be formed by dispersing and kneading the composite 2a, a conductivity-endowing material such as carbon black, a fluoro-compound such as polyvinylidene fluoride (PVDF), and an organic compound or a conductive binder (including a conductivity-endowing material) in a solvent such as N-methyl-2-pyrrolidone (NMP), and then applying the kneaded mixture to a collector 5a such as a copper foil.

The conductivity-endowing material may be, without limitations, any electron conductive material being chemically inert in a battery produced. For example, natural graphite (for example, scaly graphite, flaky graphite and amorphous graphite), artificial graphite, carbon black, acetylene black, Ketjen Black, a carbon fiber and a metal powder, a metal fiber, or a conductive material (conductivity-endowing material) such as polyphenylenes and polyacetylene may be contained alone or as a mixture. A content of the conductivity-endowing material in an activator layer is, for example, about 0.01 to 50 wt %, preferably 0.4 to 10 wt % to an anode material. Examples of a binder include polyacrylic acids, carboxymethylcellulose, polytetrafluoroethylene, polyvinylidene fluoride, polyvinyl-alcohol, starches, diacetylcellulose, hydroxypropylcellulose, polyvinyl chloride, polyvinylpyrrolidone, polyethylene, polypropylene, SBR, EPDM, sulfonated EPDM, fluoro rubbers, polybutadiene and polyethylene oxide. Among others are preferred polyacrylic acid, carboxymethylcellulose, polytetrafluoroethylene and polyvinylidene fluoride. These can be used alone or in combination of two or more.

The collector 5a is an electrode for taking a current out of or into a battery during charge/discharge. The collector 5a may be made of any conductive metal including, but not limited to, elemental metals such as aluminum, copper, stainless steel, gold, tungsten and molybdenum and their alloys. Since the collector 5a preferably has a sufficient thickness to maintain strength, the thickness is preferably 4 to 100 μm. In the light of improving an energy density, the thickness is more preferably 5 to 30 μm. For improving adhesiveness to the activator layer 1a, a center-line average roughness (Ra) of the collector 4a is preferably 1/10 or more, more preferably 1/5 or more of the thickness of the collector 4a.

A secondary battery according to the present invention has an anode as described above, and is constructed by assembling, in addition to the anode, a cathode, a separator, an electrolytic solution and so on into a case.

A cathode in a secondary battery according to this invention may be formed by dispersing and kneading a complex oxide $Li_mMO_2$ (wherein M is a single metal or a plurality of metals and contains at least one transition metal) such as $Li_mCoO_2$, $Li_mNiO_2$, $Li_mMn_2O_4$, $Li_mMnO_3$ and $Li_mNi_nC_{1-n}O_2$, a conductive material such as carbon black and a binder such as polyvinylidene fluoride (PVDF) in a solvent such as N-methyl-2-pyrrolidone (NMP) and then applying the kneaded mixture to a substrate such as an aluminum foil.

A separator which can be used in a secondary battery according to this invention may be a porous film made of, for example, a polyolefin such as polypropylene and polyethylene, or a fluororesin.

A case which can be used in a secondary battery of this invention may have an shape such as a cylinder with a bottom, a prism with a bottom and a bag. The above case can be formed from, for example, a film or a metal plate. The case from the above metal plate (metal can) may be made of, for example, aluminum, iron, stainless steel or nickel. Examples of a film constituting the above case include a metal film, a resin film such as a thermoplastic resin and a composite film having a metal layer and a resin layer (for example, a laminate film where one or both sides of a flexible metal layer is coated with a resin layer such as a thermoplastic resin). Among others, a laminate film is desirable because it is light-weight, strong and capable of preventing moisture from entering from outside. The above metal film may be formed from a plate material such as aluminum, iron, stainless steel and nickel. The resin layer constituting the above composite film may be, for example, made of a thermoplastic resin. The above thermoplastic resin may be a polyolefin such as polyethylene and polypropylene. Each of the above resin layers may be formed from one or more resins. The metal layer in the above composite film may be made of a metal such as aluminum, iron, stainless steel and nickel, which can be used alone or in combination of two or more. Among others, it is made of aluminum in the light of preventing moisture from entering the inside of a battery. The case constructed using the above composite film can be sealed by, for example, heat seal. It is, therefore, desirable to applying a thermoplastic resin on the inner surface of the case. A melting point of the above thermoplastic resin is preferably 100° C. or higher, more preferably within the range of 140 to 250° C. The above thermoplastic resin may be a polyolefin such as polyethylene and polypropylene. Particularly preferred is polypropylene having a melting point of 150° C. or higher because of its higher sealing strength in a heat seal. A thickness of the above film material or the metal plate is desirably 0.5 mm or less, for achieving a higher energy density. If a thickness of the film material or the metal plate is more than 0.5 mm, improvement in a volume energy density and weight energy density in a lithium ion secondary battery may be inhibited. A thickness of the film material or the metal plate is more preferably 0.05 mm or more. A thickness of the film material or the metal plate within the above range allows case strength to be ensured while improving a volume energy density and weight energy density in a lithium ion secondary battery. Thus, a thinner and more light-weight battery can be provided while ensuring case strength.

A secondary battery of this invention can be prepared by laminating an anode with a cathode via the above separator under an atmosphere of dry air or an inert gas or by winding such a laminate, and then encapsulating it in the above case.

An electrolytic solution used can be prepared by dissolving a solvent-soluble lithium salt in an organic solvent, which is alone or in combination of two or more selected from aprotic solvents including cyclic carbonates such as propylene carbonate (PC), ethylene carbonate (EC), butylene carbonate (BC) and vinylene carbonate (VC); linear carbonates such as dimethyl carbonate (DMC), diethyl carbonate (DEC), ethyl methyl carbonate (EMC) and dipropyl carbonate (DPC); aliphatic carboxylates such as methyl formate, methyl acetate and ethyl propionate; γ-lactones such as γ-butyrolactone; linear ethers such as 1,2-diethoxyethane (DEE) and ethoxymethoxyethane (EME); cyclic ethers such as tetrahydrofuran and 2-methyltetrahydrofuran; and dimethylsulfoxide, 1,3-dioxolan, formamide, acetamide, dimethylformamide, dioxolan, acetonitrile, propylnitrile, nitromethane, ethyl monoglyme, phosphoric acid triesters, trimethoxymethane, dioxolan derivatives, sulfolane, methylsulfolane, 1,3-dimethyl-2-imidazolidinone, 3-methyl-2-oxazolidinone, propylene carbonate derivatives, tetrahydrofuran derivatives, ethyl ether, 1,3-propanesultone, anisole and N-methylpyrrolidone. Examples of the lithium salt include $LiPF_6$, $LiAsF_6$, $LiAlCl_4$, $LiClO_4$, $LiBF_4$, $LiSbF_6$, $LiCF_3SO_3$, $LiCF_3CO_2$, $Li(CF_3SO_2)_2$, $LiN(CF_3SO_2)_2$, $LiB_{10}Cl_{10}$, lithium lower aliphatic carboxylates, chloroborane lithium, lithium tetraphenylborate, LiBr, LiI, LiSCN, LiCl and imides. A polymer electrolyte may be used in place of an electrolytic solution.

EXAMPLES

This invention will be detailed with reference to following Examples.

Example 1

An anode having the configuration shown in FIG. 1 was prepared.

SiO and Au were used as an Si oxide and a noble metal constituting an activator layer 1a, respectively. A collector 5a was an electrolytic copper foil with a thickness of 25 μm and a center-line average roughness (Ra) of 2.5 μm. SiO and Au were simultaneously vapor-deposited using two vapor deposition sources of SiO and Au to form an activator layer 1a to 5 μm as an anode. An atomic ratio of Au/Si was adjusted to be 0.1.

Next, a coin type battery was manufactured using the anode. Using $LiCoO_2$ powder with an average particle size of 10 μm as a cathode activator, the $LiCoO_2$ powder, graphite and PVDF were mixed in a weight ratio of 90:6:4, and was slurried in N-methylpyrrolidone as a solvent. The slurry was thoroughly kneaded and then applied onto an Al foil with a thickness of 20 μm. It was dried at 120° C. for 1 hour and pressed by a roller press to form a cathode. As an electrolytic solution was used a 1 mol/L solution of $LiPF_6$ in a 3:7 mixture of ethylene carbonate (EC) and diethyl carbonate (DEC).

The battery thus manufactured was subjected to a charge/discharge cycle test where it was charged at a charging current of 1 mA and a final charging voltage of 4.2 V and discharged at a discharging current of 1 mA and a final discharging voltage of 2.7 V.

Example 2

Ag was used as a noble metal. An atomic ratio of O/Si was adjusted to be 0.8 by simultaneous vapor deposition of Si and $SiO_2$. An atomic ratio of Ag/Si in the activator layer was adjusted to be 0.1. As described in Example 1 for the other conditions, a coin type battery was manufactured.

Example 3

Pd was used as a noble metal. An atomic ratio of Pd/Si in the activator layer was adjusted to 0.2. As described in Example 1 for the other conditions, a coin type battery was manufactured.

Example 4

Pt was used as a noble metal. An atomic ratio of O/Si was adjusted to be 1.5 by simultaneously vapor deposition Si and $SiO_2$. An atomic ratio of Pt/Si in the activator layer was adjusted to be 0.2. As described in Example 1 for the other conditions, a coin type battery was manufactured.

Example 5

Rh was used as a noble metal. An atomic ratio of Rh/Si in the activator layer was adjusted to be 0.25. As described in Example 1 for the other conditions, a coin type battery was manufactured.

Example 6

Ir was used as a noble metal. An atomic ratio of Ir/Si in the activator layer was adjusted to be 0.1. As described in Example 1 for the other conditions, a coin type battery was manufactured.

Example 7

Ru was used as a noble metal. An atomic ratio of Ru/Si in the activator layer was adjusted to be 0.01. As described in Example 1 for the other conditions, a coin type battery was manufactured.

Example 8

Os was used as a noble metal. An atomic ratio of Os/Si in the activator layer was adjusted to be 0.05. As described in Example 1 for the other conditions, a coin type battery was manufactured.

Example 9

Re was used as a noble metal. An atomic ratio of Re/Si in the activator layer was adjusted to be 0.3. As described in Example 1 for the other conditions, a coin type battery was manufactured.

Example 10

Au and Pd were used as noble metals. An atomic ratio of (Au+Pd)/Si in the activator layer was adjusted to be 0.4 by simultaneous vapor deposition of SiO, Au and Pd as vapor deposition sources although an atomic ratio of Au/Pd was 1:1. As described in Example 1 for the other conditions, a coin type battery was manufactured.

Example 11

Pt and Pd were used as noble metals. An atomic ratio of (Pt+Pd)/Si in the activator layer was adjusted to be 0.5 by simultaneous vapor deposition of SiO, Pt and Pd as vapor deposition sources although an atomic ratio of Pt/Pd was 2:1. As described in Example 1 for the other conditions, a coin type battery was manufactured.

Example 12

Au and Ru were used as noble metals. An atomic ratio of (Au+Ru)/Si in the activator layer was adjusted to be 0.75 by simultaneous vapor deposition of SiO, Au and Ru as vapor deposition sources although an atomic ratio of Au/Ru was 3:1. As described in Example 1 for the other conditions, a coin type battery was manufactured.

Example 13

An activator layer was formed by sputtering in place of vapor deposition. An atomic ratio of O/Si in the activator layer was adjusted to be 1.9 by simultaneous sputtering of Si and $SiO_2$. An atomic ratio of Au/Si in the activator layer was adjusted to be 0.7. As described in Example 1 for the other conditions, a coin type battery was manufactured.

Example 14

An activator layer was formed by alternately depositing SiO and Au by sputtering in place of vapor deposition. An atomic ratio of Au/Si in the activator layer was adjusted to be 1. As described in Example 1 for the other conditions, a coin type battery was manufactured.

Example 15

An activator layer was formed by alternately depositing SiO and Au by vapor deposition. An atomic ratio of Au/Si in the activator layer was adjusted to be 1. As described in Example 1 for the other conditions, a coin type battery was manufactured.

Comparative Example 1

An anode was formed by vapor deposition of SiO alone without a noble metal. As described in Example 1 for the other conditions, a coin type battery was manufactured.

X-ray diffraction analysis for an anode before assembling a battery showed that the activator layers 1a in Examples 1 to 15 and Comparative Example 1 had an amorphous structure. By analyzing the anode for its elemental composition by X-ray photoemission spectroscopy after argon-ion etching for one hour, it was demonstrated that an atomic ratio of O/Si in Examples 1 to 15 and Comparative Example 1 was the value of 0.8 to 1.9.

Table 1 shows a relative discharge-capacity energy density (per a unit volume of the activator layer) in Examples 1 to 15 and Comparative Example 1 to Comparative Example 1. Table 1 also shows an initial charge/discharge efficiency and a capacity retention ratio in Examples 1 to 15 and Comparative Example 1. A capacity retention ratio was calculated by Equation (1):

$$\text{Capacity retention ratio (\%)} = (\text{discharge capacity in the 100th cycle})/(\text{discharge capacity in the 5th cycle}) \times 100. \quad \text{Equation (1)}$$

In Examples 1 to 15, a discharge-capacity energy density was 1.7 folds or more of Comparative Example 1. In any of Examples 1 to 15 and Comparative Example 1, a capacity retention ratio was 80% or more, indicating excellent cycle properties. Comparative Example 1 exhibited excellent cycle properties, but had an insufficient initial charge/discharge efficiency of 25% because of the absence of a noble metal. On the other hand, Examples 1 to 15 in which conductivity was improved by adding a noble metal had a higher initial charge/discharge efficiency by 59% or more than Comparative Example 1. It was thus demonstrated that Examples 1 to 15 could provide a battery exhibiting a higher initial charge/discharge efficiency, a higher energy density and excellent cycle properties.

TABLE 1

| | Atomic ratio | | | | Initial | Relative anode discharge-capacity | Capacity retention |
|---|---|---|---|---|---|---|---|
| | Noble metal | Noble metal/Si | O/Si | Method for forming an activator layer | charge/discharge efficiency (%) | energy density to Comparative Example 1 | ratio (%) |
| Ex. 1 | Au | 0.1 | 1 | Vapor deposition | 87 | 3.2 | 80 |
| Ex. 2 | Ag | 0.1 | 0.8 | Vapor deposition | 86 | 3.1 | 82 |
| Ex. 3 | Pd | 0.2 | 1 | Vapor deposition | 88 | 2.9 | 81 |
| Ex. 4 | Pt | 0.2 | 1.5 | Vapor deposition | 87 | 2.9 | 83 |
| Ex. 5 | Rh | 0.25 | 1 | Vapor deposition | 87 | 2.8 | 84 |
| Ex. 6 | Ir | 0.1 | 1 | Vapor deposition | 85 | 3.1 | 81 |
| Ex. 7 | Ru | 0.01 | 1 | Vapor deposition | 84 | 3.3 | 82 |
| Ex. 8 | Os | 0.05 | 1 | Vapor deposition | 85 | 3.2 | 83 |
| Ex. 9 | Re | 0.3 | 1 | Vapor deposition | 87 | 2.7 | 82 |
| Ex. 10 | Au + Pd | 0.4 | 1 | Vapor deposition | 86 | 2.5 | 80 |
| Ex. 11 | Pt + Pd | 0.5 | 1 | Vapor deposition | 87 | 2.3 | 82 |
| Ex. 12 | Au + Ru | 0.75 | 1 | Vapor deposition | 87 | 2.0 | 81 |
| Ex. 13 | Au | 0.7 | 1.9 | Sputtering | 86 | 2.0 | 83 |
| Ex. 14 | Au | 1 | 1 | Sputtering | 85 | 1.7 | 83 |
| Ex. 15 | Au | 1 | 1 | Vapor deposition | 87 | 1.7 | 84 |
| Comp. Ex. 1 | — | | 1 | Vapor deposition | 25 | 1.0 | 80 |

Example 16

Amorphous particulate SiO with an average particle size of 5 μm was used as an Si oxide, particulate Au with an average particle size of 1 μm was used as a noble metal, and lithium metal with an average particle size of 1 mm was used. The amorphous particulate SiO, the particulate Au and the particulate lithium metal were combined such that an atomic ratio of Li, Si and Au was 20:10:1. Then, the powder thus prepared was subjected to repetitive pressing by a planetary ball mill apparatus for 12 hours. A ball mill vessel and a ball with a diameter of 10 mm were made of zirconia, and powder preparation and ball milling were conducted under an Ar atmosphere. Then, it was heat-treated at 1100° C. for 1 hour under an Ar atmosphere, to give a particulate anode activator with an average particle size of 5 μm. A solution of PVDF in N-methylpyrrolidone and the particulate anode activator were kneaded in a weight ratio of the particulate anode activator:PVDF=90:10, and the resulting slurry was applied to an electrolytic copper foil with a thickness of 20 μm and a surface roughness of 5 μm. It was dried at 120° C. for 1 hour, pressed by a roller press to a volume filling ratio of 60% in the electrode application area, and then passed through a slit to give an anode.

Next, a prism laminate battery was manufactured using the anode. Using $LiCoO_2$ powder with an average particle size of 10 μm as a cathode activator, the $LiCoO_2$ powder, graphite and PVDF were mixed in a weight ratio of 90:6:4, and was slurried in N-methylpyrrolidone as a solvent. The slurry was thoroughly kneaded and then applied onto an Al foil with a thickness of 20 μm. It was dried at 120° C. for 1 hour and pressed by a roller press and then passed through a slit to form a cathode. As an electrolytic solution was used a 1 mol/L solution of $LiPF_6$ in a 3:7 mixture of ethylene carbonate (EC) and diethyl carbonate (DEC).

The battery thus manufactured was subjected to a charge/discharge cycle test where it was charged at a charging current of 0.9 mA and a final charging voltage of 4.2 V and discharged at a discharging current of 0.9 mA and a final discharging voltage of 2.7 V.

Example 17

Particulate Ag with an average particle size of 1 μm was used as a noble metal. As described in Example 16 for the other conditions, a prism laminate battery was manufactured.

Example 18

Particulate Pt with an average particle size of 1 μm was used as a noble metal. Particulate $Li_2SiO_3$ with an average particle size of 10 μm was used in place of particulate amorphous SiO and particulate lithium metal. They were combined in such a ratio that an atomic ratio of Si in the particulate $Li_2SiO_3$ to particulate Pt was 10:1. The resulting product was pressed and heat-treated as described in Example 16, to give a particulate anode activator with an average particle size of 10 μm. As described in Example 16 for the other conditions, a prism laminate battery was manufactured.

Example 19

Using two vapor deposition sources of SiO and Pd in vapor deposition, SiO and Pd were simultaneously vapor-deposited in such a ratio that an atomic ratio of Si to Pd was 10:1, to form a bulk activator, which was then ground and classified. The particles thus obtained were combined with Li metal with an average particle size of 1 mm in such a ratio that an atomic ratio of Li, Si and Pd is 20:10:1. The resulting product was pressed and heat-treated as described in Example 16, to form a particulate anode activator with an average particle size of 1 μm. As described in Example 16 for the other conditions, a prism laminate battery was manufactured.

Example 20

Particulate Pt with an average particle size of 1 μm was used as a noble metal. Particulate $Li_4SiO_4$ with an average particle size of 10 μm as a lithium silicate was used in place of particulate amorphous SiO and particulate lithium metal. They were combined in such a ratio that an atomic ratio of Si in the particulate $Li_4SiO_4$ to particulate Pt was 10:1. The resulting product was pressed and heat-treated as described in Example 16, to give a particulate anode activator with an average particle size of 10 μm. As described in Example 16 for the other conditions, a prism laminate battery was manufactured.

Example 21

Particulate Pd with an average particle size of 1 μm was used as a noble metal. Particulate $Li_4SiO_4$ with an average particle size of 10 μm as a lithium silicate was used in place of particulate lithium metal. They were combined in such a ratio that an atomic ratio of Li, Si and Pd in the particulate activator was 8:3:1. The resulting product was pressed and heat-treated as described in Example 16, to give a particulate anode activator with an average particle size of 10 μm. As described in Example 16 for the other conditions, a prism laminate battery was manufactured.

Example 22

Particulate Pd with an average particle size of 1 μm was used as a noble metal. Particulate $Li_2SiO_3$ with an average particle size of 10 μm as a lithium silicate was used in place of particulate lithium metal. They were combined in such a ratio that an atomic ratio of Li, Si and Pd in the particulate activator was 2:3:1. The resulting product was pressed and heat-treated as described in Example 16, to give a particulate anode activator with an average particle size of 10 μm. As described in Example 16 for the other conditions, a prism laminate battery was manufactured.

Example 23

$Li_2SiO_3$ was used as a lithium silicate. Rh was used as a noble metal. Using three vapor deposition sources of Rh, $Li_2SiO_3$ and Li in vapor deposition, Rh, $Li_2SiO_3$ and Li were simultaneously vapor-deposited on a collector in such a ratio that an atomic ratio of Li, Si and Rh is 10:5:1, to form an anode. A collector 5a was an electrolytic copper foil with a thickness of 25 μm and a center-line average roughness (Ra) of 25 μm. As described in Example 16 for the other conditions, a prism laminate battery was manufactured.

Comparative Example 2

An electrode was formed without a noble metal 4a. As described in Example 16 for the other conditions, a prism battery was manufactured.

Table 2 shows a relative discharge-capacity energy density (per a unit volume of the activator layer) in Examples 16 to 23 and Comparative Example 2 to Comparative Example 2.

Table 2 also shows an initial charge/discharge efficiency and a capacity retention ratio in Examples 16 to 23 and Comparative Example 2. A capacity retention ratio was calculated by the above-described Equation (1).

In Examples 16 to 23, a discharge-capacity energy density was 2.1 folds or more of Comparative Example 2. In any of Examples 16 to 23 and Comparative Example 2, a capacity retention ratio was 80% or more, indicating excellent cycle properties. Comparative Example 2 exhibited excellent cycle properties, but had an insufficient initial charge/discharge efficiency of 25% because of the absence of a noble metal. On the other hand, Examples 16 to 23 in which conductivity was improved by adding a noble metal had a higher initial charge/discharge efficiency by 59% or more. It was thus demonstrated that Examples 16 to 23 could provide a battery exhibiting a higher initial charge/discharge efficiency, a higher energy density and excellent cycle properties.

TABLE 2

|  | Noble metal | Initial charge/ discharge efficiency (%) | Relative anode discharge-capacity energy density to Comparative Example 2 | Capacity retention ratio (%) |
| --- | --- | --- | --- | --- |
| Ex. 16 | Au | 86 | 2.4 | 81 |
| Ex. 17 | Ag | 85 | 2.4 | 80 |
| Ex. 18 | Pt | 84 | 2.3 | 82 |
| Ex. 19 | Pd | 86 | 2.4 | 81 |
| Ex. 20 | Pt | 86 | 2.1 | 80 |
| Ex. 21 | Pd | 87 | 2.6 | 81 |
| Ex. 22 | Pd | 86 | 2.7 | 82 |
| Ex. 23 | Rh | 84 | 2.2 | 81 |
| Comp. Ex. 2 | — | 25 | 1.0 | 80 |

The invention claimed is:

1. An anode material for a secondary battery which is used for an anode in a non-aqueous electrolyte secondary battery having at least the anode, a cathode and a lithium-ion conducting non-aqueous electrolyte, comprising a particulate composite which comprises a mixture of an Si oxide and at least one metal selected from the group consisting of Pd, Pt, Au, Rh, Ir, Ru, Os and Re, wherein the particulate composite has a structure where the Si oxide is present in a matrix of at least one metal selected from the group consisting of Pd, Pt, Au, Rh, Ir, Ru, Os and Re.

2. An anode material for a secondary battery which is used for an anode in a non-aqueous electrolyte secondary battery having at least the anode, a cathode and a lithium-ion conducting non-aqueous electrolyte, comprising a particulate composite which comprises a mixture of a lithium silicate and at least one metal selected from the group consisting of Pd, Pt, Au, Rh, Ir, Ru, Os and Re, wherein the particulate composite has a structure where the lithium silicate is present in a matrix of at least one metal selected from the group consisting of Pd, Pt, Au, Rh, Ir, Ru, Os and Re.

* * * * *